(12) United States Patent
Okamoto et al.

(10) Patent No.: US 6,797,345 B2
(45) Date of Patent: Sep. 28, 2004

(54) AROMATIC LIQUID-CRYSTALLINE POLYESTER METAL LAMINATE

(75) Inventors: Satoshi Okamoto, Tsukuba (JP); Manabu Hirakawa, Tsukuba (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 10/128,239

(22) Filed: Apr. 24, 2002

(65) Prior Publication Data

US 2003/0029634 A1 Feb. 13, 2003

(30) Foreign Application Priority Data

Apr. 27, 2001 (JP) ........................ 2001-132008
Apr. 27, 2001 (JP) ........................ 2001-132009
Apr. 27, 2001 (JP) ........................ 2001-132010
May 31, 2001 (JP) ........................ 2001-164066

(51) Int. Cl.[7] .............................. B32B 3/00; H05K 1/00
(52) U.S. Cl. .................... 428/1.6; 428/1.62; 428/209; 428/901; 174/258
(58) Field of Search ................. 428/1.6, 1.62, 428/209, 901; 252/299.01

(56) References Cited

U.S. PATENT DOCUMENTS

| | | | |
|---|---|---|---|
| 5,360,672 A | * 11/1994 | Saito et al. | 428/480 |
| 5,759,674 A | * 6/1998 | Furuta et al. | 428/209 |
| 5,997,765 A | * 12/1999 | Furuta et al. | 252/299.01 |
| 6,124,004 A | * 9/2000 | Furuta et al. | 428/1.1 |
| 6,140,455 A | * 10/2000 | Nagashima et al. | 528/190 |

FOREIGN PATENT DOCUMENTS

| | | |
|---|---|---|
| JP | 61-130041 A | 6/1986 |
| JP | 2-252738 | 10/1990 |
| JP | 3-183185 | 8/1991 |
| JP | 8-323923 | 12/1996 |
| JP | 9-76417 | 3/1997 |
| JP | 9-174786 | 7/1997 |
| JP | 10-294335 | 11/1998 |
| JP | 11-181116 | 7/1999 |
| JP | 2000-44797 | 2/2000 |
| JP | 2000-71376 | 3/2000 |
| JP | 2000-343610 | 12/2000 |

* cited by examiner

*Primary Examiner*—Cathy Lam

(74) *Attorney, Agent, or Firm*—Birch, Stewart, Kolasch & Birch, LLP

(57) ABSTRACT

A laminate obtained by dissolving an aromatic liquid-crystalline polyester in an organic solvent to obtain a solution, casting the solution and removing the solvent to give a film, and laminating the film with a metal layer.

7 Claims, 3 Drawing Sheets

(1) RESIN LAYER FORMATION
(2) BORING
(3) ELECTROLESS COPPER PLATING
(4) ELECTROLYTIC COPPER PLATING
(5) WIRING BY ETCHING COPPER
(6) COPPER WIRING
(7) CORE SUBSTRATE
(8) INSULATION RESIN (1) RESIN LAYER FORMATION
(2) BORING
(3) ELECTROLESS COPPER PLATING
(4) ELECTROLYTIC COPPER PLATING
(5) WIRING BY ETCHING COPPER
(6) COPPER WIRING
(7) CORE SUBSTRATE
(8) INSULATION RESIN

AROMATIC LIQUID-CRYSTALLINE POLYESTER METAL LAMINATE

BACKGROUND OF THE INVENTION

1. Field of the Invention

The present invention relates to a laminate of an aromatic liquid-crystalline polyester film and a metal, and a tape automated bonding (TAB) tape, film condenser and printed wiring board using the same.

2. Description of the Related Art

Recently, with increasing requirements for light weight and small size electric and electronic parts in the market, demands for laminated substrate of resin films and metals such as TAB tapes, film condensers, rigid, flexible both-sides printed wiring boards and the like are being enlarged. As the raw materials of these laminated bodies of resin films and metals, generally used are polyphenylene sulfide and polyimide resins, however, they have problems that electric properties are not necessarily sufficient, water absorbing property is high and the like.

Therefore, there are developments on laminated substrates of aromatic liquid-crystalline polyesters and metals having low water absorbing property and excellent electric properties.

For example, JP-A Nos. 61-130041, 2-252738, 3-183185 and 5-42603 disclose methods of crimping a metal foil and a liquid-crystalline polymer film produced by an extrusion or inflation molding process. However, the liquid-crystalline polymer film produced by an extrusion or inflation molding process shows poor film forming processability due to large anisotropy and cause deformation of the film, namely, abilities of this film cannot be accepted as satisfactory because of such problems.

SUMMARY OF THE INVENTION

An object of the present invention is to provide a laminate of an aromatic liquid-crystalline polyester film and a metal, having excellent processability due to small anisotropy while keeping excellent electric properties.

The present inventors have intensively studied to find laminated substrates having no problems as described above, and resultantly found that a laminate of a liquid-crystalline polymer film and a metal obtained by a casting method has excellent processability due to small anisotropy while keeping excellent electric properties, leading to completion of the invention.

Namely, the present invention relates to a laminate obtained by dissolving an aromatic liquid-crystalline polyester in an organic solvent to obtain a solution, casting the solution and removing the solvent to give a film, and laminating the film with a metal layer.

1: Carrier taper for tape automated bonding

2: Sprockets (four positions)

Figure 2:
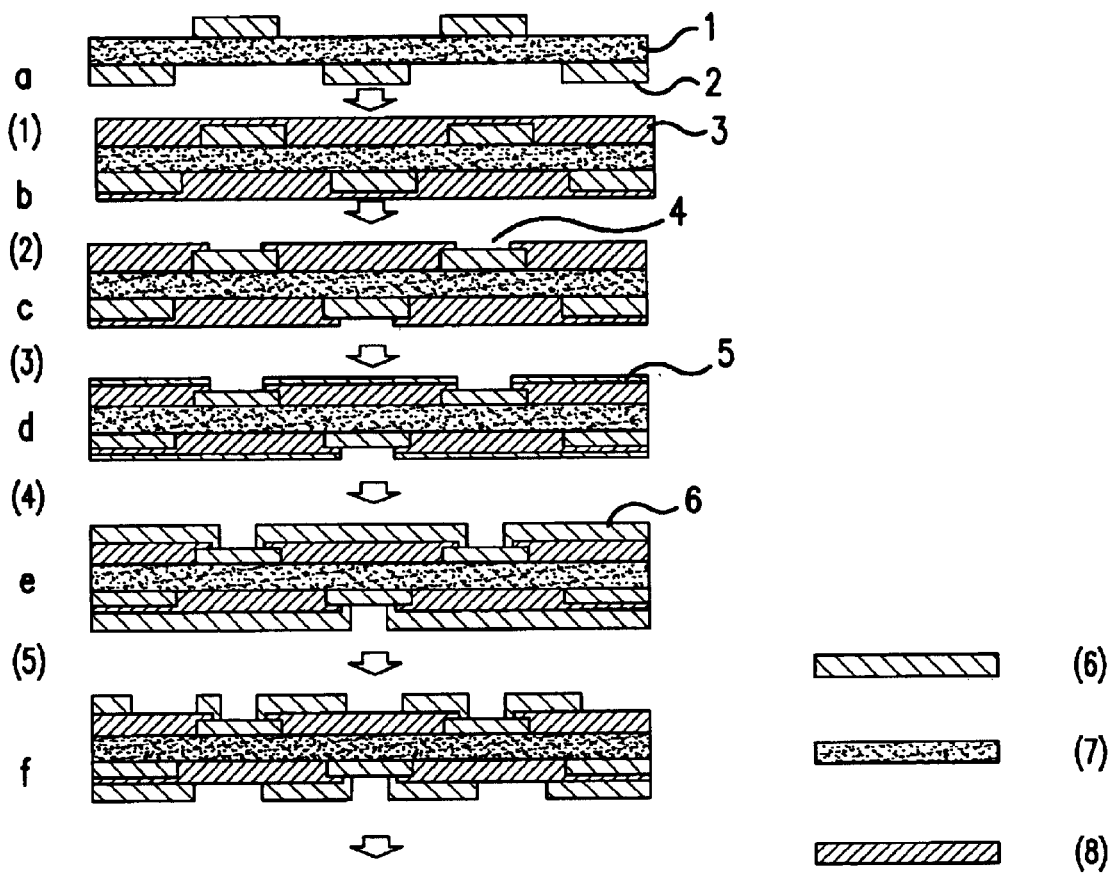

FIG. 2 is a view for illustrating one example of a method of producing a multi-layer printed wiring board.

1: Resin layer formation

2: Boring

3: Electroless copper plating

4: Electrolytic copper plating

5: Wiring by etching copper

6: Copper wiring

7: Core Substrate

8: Insulation Resin

Figure 3:
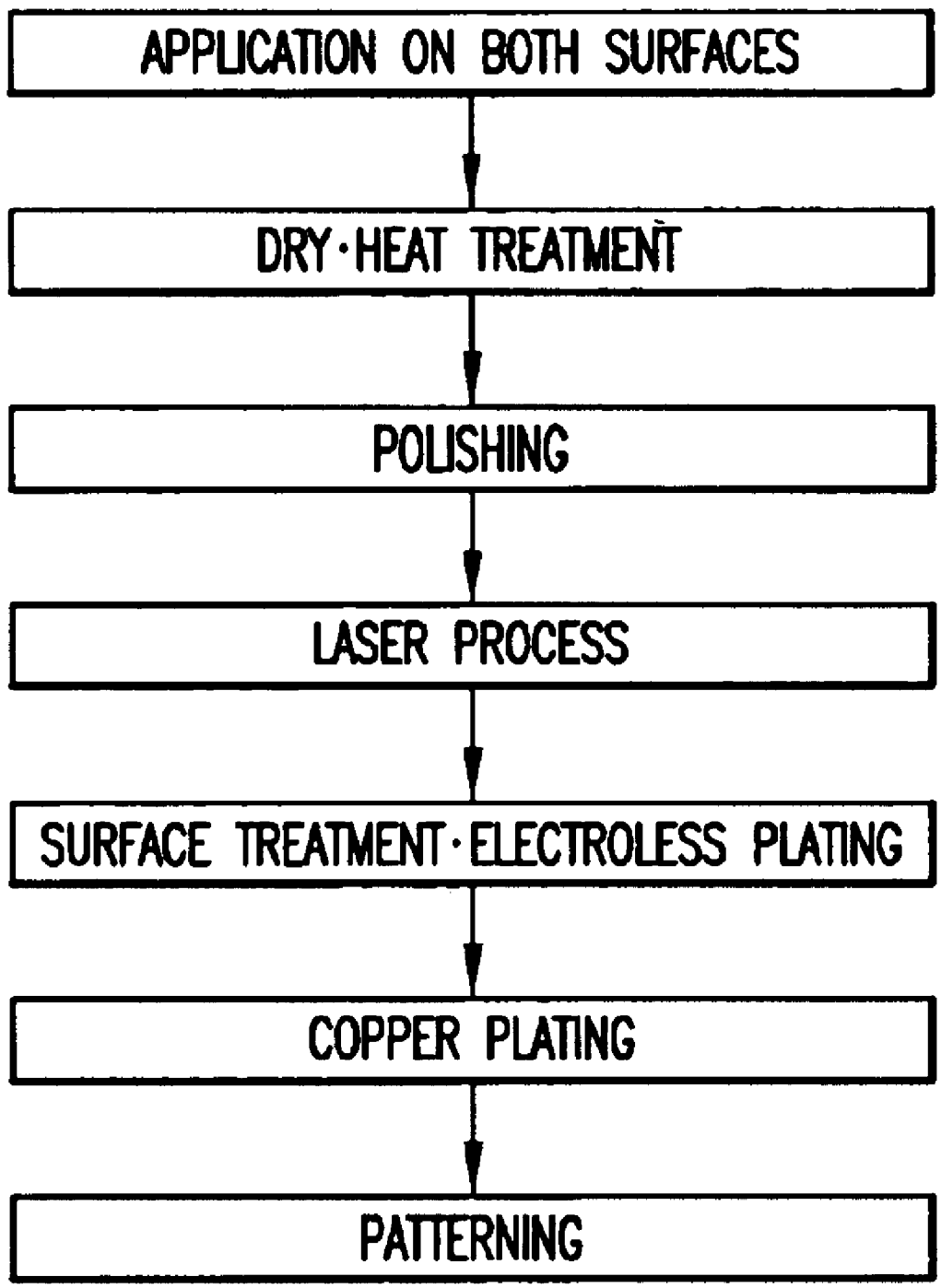

FIG. 3 is a block view for illustrating one example of a method of producing a multi-layer printed wiring board.

DETAILED DESCRIPTION OF THE PREFERRED EMBODIMENTS

The liquid-crystalline polyester used in the present invention is a polyester called a thermotropic liquid-crystalline polyester, and for example, (1) those containing a combination of an aromatic dicarboxylic acid, aromatic diol and aromatic hydroxycarboxylic acid, (2) those containing different kinds of aromatic hydroxycarboxylic acids, (3) those containing a combination of an aromatic dicarboxylic acid and aromatic diol, (4) those obtained by reacting an aromatic hydroxycarboxylic acid with a polyester such as polyethylene terephthalate and the like are listed, and such polyesters take anisotropic molten state at temperatures of 400° C. or less. Instead of these aromatic dicarboxylic acid, aromatic diol and aromatic hydroxycarboxylic acid, ester-forming derivatives thereof may be used.

As the ester-forming derivative of a carboxylic acid, exemplified are those in which a carboxyl group has high reactivity with an acid chloride, acid anhydride and the like and a derivative promoting a polyester production reaction is formed, and those in which a carboxyl group forms an ester with alcohols, ethylene glycol and the like and a derivative forming a polyester by an ester-exchange reaction is formed.

As the ester-forming derivative of a phenolic hydroxyl group, exemplified are those in which a phenolic hydroxyl group forms an ester with carboxylic acids and a derivative forming a polyester by an ester-exchange reaction is formed.

The aromatic dicarboxylic acid, aromatic diol and aromatic hydroxycarboxylic acid may be substituted with a halogen atom, methyl group, ethyl group, allyl group and the like provided ester-forming property is not disturbed.

Examples of the repeating structural unit of the liquid-crystalline polyester include, but not limited to, the following units.

Repeating structural units derived from aromatic hydroxycarboxylic acids:

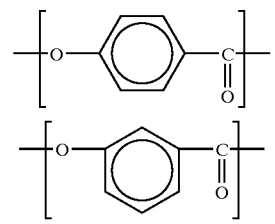

(A₁)

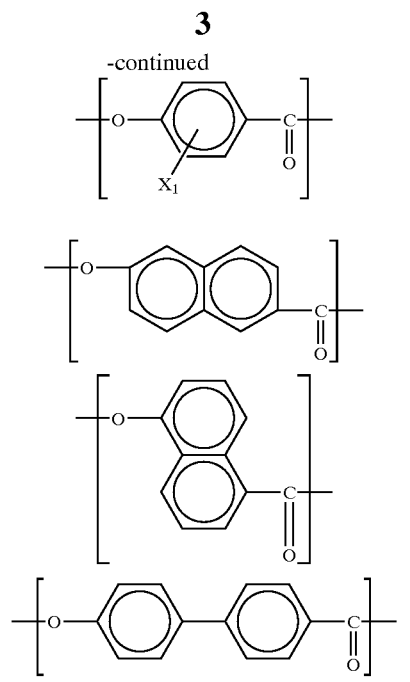
(A₂)
wherein, $X_1$ represents a halogen atom or alkyl group.
Repeating structural units derived from aromatic dicarboxylic acids:
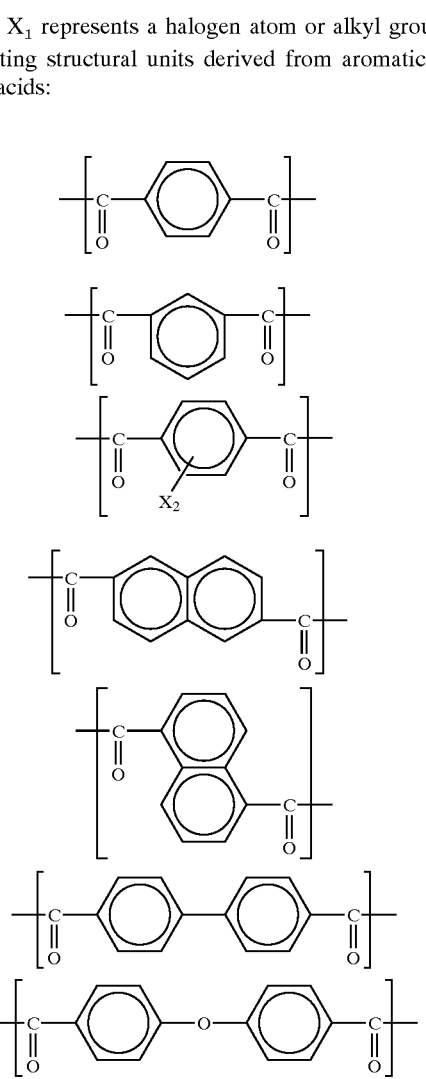
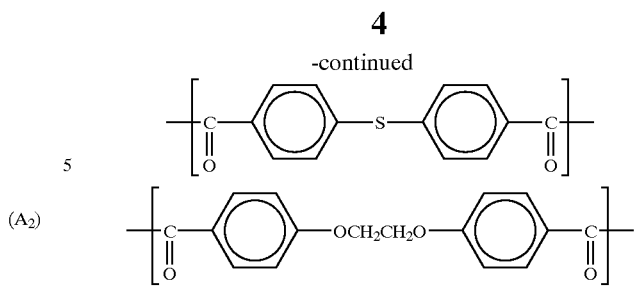
wherein, $X_2$ represents a halogen atom, alkyl group or aryl group.
Repeating structural units derived from aromatic diols:
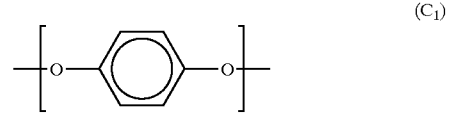 (C₁)
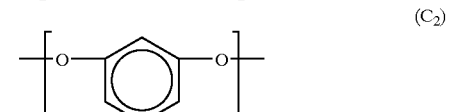 (C₂)
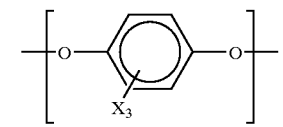
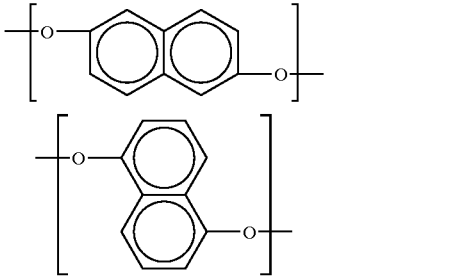 (C₃)
(C₄)

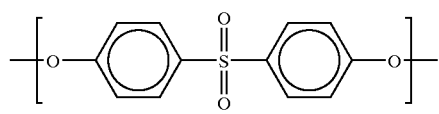
(C₅)

wherein, $X_3$ represents a halogen atom, alkyl group or aryl group, and $X_4$ represents a hydrogen atom, halogen atom or alkyl group.

In the above-mentioned $X_1$ to $X_4$, the alkyl group is preferably an alkyl group having 1 to 10 carbon atoms and the aryl group is preferably an aryl group having 6 to 20 carbon atoms.

The aromatic liquid-crystalline polyester preferably contains a repeating unit of the above-mentioned formula $A_1$ in an amount of at least 30 mol %, from the standpoint of balance of heat resistance and mechanical property.

Specifically, as the combination of repeating structural units, for example, following (a) to (f) are listed.

(a): a mixture of $(A_1)$, $(B_2)$, $(C_3)$, or, $(A_1)$, $(B_1)$ and $(B_2)$, $(C_3)$ (b): combinations (a) of structural units, wherein $(C_3)$ is partially or totally substituted by $(C_1)$ (c): combinations (a) of structural units, wherein $(C_3)$ is partially or totally substituted by $(C_2)$ (d): combinations (a) of structural units, wherein $(C_3)$ is partially or totally substituted by $(C_4)$ (e): combinations (a) of structural units, wherein $(C_3)$ is partially or totally substituted by a mixture of $(C_4)$ and $(C_5)$ (f): combinations (a) of structural units, wherein $(A_1)$ is partially or totally substituted by $(A_2)$ It is preferable from the standpoint of liquid-crystallinity that the aromatic liquid-crystalline polyester used in the present invention comprises 30 to 80 mol % of a repeating structural unit derived from p-hydroxybenzoic acid, 10 to 35 mol % of a repeating structural unit derived from at least one compound selected from the group consisting of hydroquinone, resorcinol, 4,4'-dihydroxybiphenyl, bisphenol-A and bisphenol-S, and 10 to 35 mol % of a repeating structural unit derived from at least one compound selected from the group consisting of terephthalic acid, isophthalic acid and naphthalenedicarboxylic acid.

It is more preferable, from the standpoint of heat resistance, that the aromatic liquid-crystalline polyester used in the present invention comprises 30 to 80 mol % of a repeating structural unit derived from p-hydroxybenzoic acid, 10 to 35 mol % of a repeating structural unit derived from at least one compound selected from the group consisting of hydroquinone and 4,4'-dihydroxybiphenyl, and 10 to 35 mol % of a repeating structural unit derived from at least one compound selected from the group consisting of terephthalic acid and isophthalic acid.

As the method of producing a liquid-crystalline polyester used in the present invention, conventional methods can be adopted, and for example, methods described in JP-B Nos. 47-47870 and 63-3888, and the like are listed.

The organic solvent used for dissolution of an aromatic liquid-crystalline polyester is not particularly restricted providing it can dissolve an aromatic liquid-crystalline polyester, and organic solvents containing 30% by weight or more of a phenol compound of the following general formula (I) are preferable since these solvents can dissolve an aromatic liquid-crystalline polyester at normal temperature or under heat, and organic solvents containing 60% by weight or more of such a phenol compound are more preferable, and it is further preferable to use substantially 100% by weight of such a phenol compound as the organic solvent since there is no necessity to mix with other components.

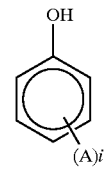
(I)

Organic solvents containing 30% by weight or more of a phenol compound of the following general formula (II) are preferable since these solvents can dissolve an aromatic liquid-crystalline polyester at relatively lower temperature, and organic solvents containing 60% by weight or more of such a phenol compound are more preferable, and it is further preferable to use substantially 100% by weight of such a phenol compound as the organic solvent since there is no necessity to mix with other components.

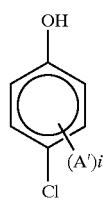
(II)

In the general formula (I), A represents a halogen atom or trihalogenated methyl group, and i represents an integer from 1 to 5. When i is 2 or more, a plurality of A may be mutually the same or different, and it is preferably that they are the same.

As the halogen atom, a fluorine atom, chlorine atom, bromine atom and iodine atom are listed, and a fluorine atom and chlorine atom are preferable.

As the examples of the general formula (I) in which the halogen atom is a fluorine atom, pentafluorophenol, tetrafluorophenol and the like are listed.

As the examples of the general formula (I) in which the halogen atom is a chlorine atom, o-chlorophenol, p-chlorophenol and the like are listed, and p-chlorophenol is preferable from the standpoint of solubility.

As the halogen in the trihalogenated methyl group, a fluorine atom, chlorine atom, bromine atom and iodine atom are listed.

As the example of the general formula (I) in which the halogen in the trihalogenated methyl group is a fluorine atom, 3,5-bistrifluoromethylphenol is mentioned.

p-chlorophenol may further have a substituent, and phenol compounds of the above-mentioned general formula (II) are preferable from the standpoint of cost and availability.

Components contained in the solvent in addition to the phenol compound are not particularly limited insofar as they cause deposition of the aromatic liquid-crystalline polyester during storage of the solution or during casting as described later, and preferred components include chlorine compounds such as o-dichlorobenzene, chloroform, methylene chloride, tetrachloroethane and the like, because they do not affect the solubility.

The amount of an aromatic liquid-crystalline polyester is preferably from 0.5 to 100 parts by weight based on 100 parts by weight of an organic solvent containing 30% by weight or more of a phenol compound, and more preferably from 1 to 50 parts by weight, further preferably from 3 to 10 parts by weight from the standpoint of workability or economy. When the amount is less than 0.5 parts by weight, productivity tends to lower, and when over 100 parts by weight, solubility tends to become difficult.

The laminate of the present invention can be produced, for example, by the following method.

(1) An aromatic liquid-crystalline polyester is dissolved in an organic solvent to obtain an aromatic liquid-crystalline polyester solution, this is, if necessary, filtrated through a filter to remove fine extraneous material contained in the solution, then, the solution is cast uniformly and smoothly on the surface of a metal foil by various means such as, for example, a roller coat method, dip coat method, spray coat method, spinner coat method, curtain coat method, slot coat method, screen printing method and the like, then, the solvent is removed to give an aromatic liquid-crystalline polyester film which is laminated with a metal foil.

(2) An aromatic liquid-crystalline polyester film obtained in the same manner as in (1) is crimped under heat to paste on a metal foil.

(3) An aromatic liquid-crystalline polyester film obtained in the same manner as in (1) and a metal foil are pasted with an adhesive.

(4) A metal layer is formed by vapor deposition on an aromatic liquid-crystalline polyester film obtained in the same manner as in (1).

To the aromatic liquid-crystalline polyester solution, known fillers, resins and the like may be added in a range not deteriorating the object of the present invention.

As the filler, for example, organic fillers such as hardened epoxy resin powders, melamine resin powders, urea resin powders, benzoguanamine resin powders, polyester resin powders and the like, inorganic fillers such as silica, alumina, titanium oxide, calcium carbonate and the like, are listed. Of them, silica is preferable from the standpoint of electric properties and availability.

This filler has an average particle size preferably of 0.1 $\mu$m or more and 10 $\mu$m or less, and when less than 0.1 $\mu$m, fillers mutually coagulate easily, and the viscosity of a resin solution (varnish) increases to cause handling difficulty, consequently, workability tends to decrease, and when over 10 $\mu$m, the surface smoothness of the resulting film tends to be deteriorated.

As the resin to be added into an aromatic liquid-crystalline polyester solution, for example, polyamides, polyesters, polyphenylenesulfides, polyether ketones, polycarbonates, polyethersulfones, polyphenylene ethers and modified materials thereof, thermoplastic resins such as polyetherimide and the like, and thermosetting resins such as phenol resins, epoxy resins, polyimide resins, cyanate resins and the like, are listed, and at least one of them may be added.

The method of casting an aromatic liquid-crystalline polyester solution is not particularly restricted, and a roller coat method, dip coat method, spray coat method, spinner coat method, curtain coat method, slot coat method, screen printing method and the like are listed.

The method of removing an organic solvent is not particularly restricted, and an organic solvent is preferably removed by evaporation. As the method of evaporating an organic solvent, methods such as heating, pressure reduction, ventilation and the like are listed. Of them, a method of vaporization by heating is preferable from the standpoints of productivity and handling, and vaporization by heating while ventilating is more preferable. Specifically, it is preferable to conduct previous drying at 80 to 100° C. for 30 minutes to 2 hours, and to conduct thermal treatment at 180 to 300° C. for 30 minutes to 4 hours.

The resulted aromatic liquid-crystalline polyester film may be subjected to surface treatment, if necessary. As the method of surface treatment, for example, corona discharge treatment, flame treatment, sputtering treatment, solvent treatment, UV treatment, plasma treatment and the like are listed.

Thus obtained aromatic liquid-crystalline polyester film is laminated with a metal layer by the above-mentioned methods (1) to (4), for example, The lamination method (1) is preferable since uniform film thickness and close adherence with a metal foil are easily obtained by casting an aromatic liquid-crystalline polyester solution by a roller coat method, dip coat method, spray coat method, spinner coat method, curtain coat method, slot coat method, screen printing method and the like, and then removing a solvent by drying and the like.

The lamination method (2) is preferable since an aromatic liquid-crystalline polyester film can be crimped easily with a metal foil using a press machine or heating rolls near the flow initiation temperature of the film.

In the lamination method (3), though the adhesive used is not particularly restricted, a hot melt adhesive, polyurethane adhesive and the like are exemplified. Of them, an epoxy group-containing ethylene copolymer and the like are preferably used as the adhesive.

In the lamination method (4), though the method of vapor-depositing a metal is not particularly restricted, an ion beam sputtering method, high frequency sputtering method, direct current magnetron sputtering method, glow discharge method and the like are specifically listed. Of them, a high frequency sputtering method is preferably used.

As the metal used in the present invention, for example, gold, silver, copper, nickel, aluminum and the like are listed. In uses of a TAB tape and printed wiring board, copper is preferable, and in use of a condenser, aluminum is preferable.

The laminate of the present invention is a two or more-layer laminated substrates of an aromatic liquid-crystalline polyester film and a metal layer, for example, a two-layer structure of the above-mentioned aromatic liquid-crystalline polyester film and a metal layer, a three-layer structure in which metal layers are laminated on both surfaces of the above-mentioned aromatic liquid-crystalline polyester film, a five-layer structure in which the above-mentioned aromatic liquid-crystalline polyester film and a metal film are laminated alternately, and the like are listed.

The laminate of the present invention may be subjected to thermal treatment, if necessary, for the purpose of enhancing mechanical strength.

EXAMPLES

The following examples illustrate the present invention below, but do not limit the scope of the present invention, needless to say.

Synthesis Example 1

Into a reaction vessel equipped with a stirring apparatus, torque meter, nitrogen gas introduction tube, thermometer and reflux condenser was charged 141 g (1.02 mol) of p-hydroxybenzoic acid, 63.3 g (0.34 mol) of 4,4'-dihydroxybiphenyl, 56.5 g (0.34 mol) of isophthalic acid and 191 g (1.87 mol) of acetic anhydride. The atmosphere in the reaction vessel was purged with a nitrogen gas sufficiently, then, the mixture was heated up to 150° C. over 15 minutes under a nitrogen gas flow, and allowed to reflux for 3 hours while maintaining the temperature.

Then, the mixture was heated up to 320° C. over 170 minutes while distilling off distilling by-produced acetic acid and unreacted acetic anhydride, and the time when increase in torque was recognized was regarded as completion of reaction, and the content was removed. The resulted content was cooled to room temperature, crushed with a granulator, then, kept at 270° C. for 10 hours under a nitrogen atmosphere, and a polymerization reaction was conducted in a solid layer to obtain an aromatic liquid-crystalline polyester powder.

Example 1

1 g of the aromatic liquid-crystalline polyester powder obtained in Synthesis Example 1 was added to 9 g of p-chlorophenol and the mixture was heated at 120° C., to resultantly confirm completion of dissolution to obtain a transparent solution. This solution was stirred and defoamed, to obtain an aromatic liquid-crystalline polyester solution.

The aromatic liquid-crystalline polyester solution was cast on a glass substrate, the solvent was evaporated for 1 hour at 100° C. in a ventilating over, then, the solution was further thermally treated at 250° C. for 1 hour, resultantly to obtain a film having a thickness of 30 µm. The orientation pattern was measured by a simple molecule-orientation analyzer (MOA-5012, manufactured by Oji Sokutei Kiki), and the ratio of the longitudinal direction (molecule flow direction :MD) orientation to transverse direction orientation (TD) was measured. The results are shown in Table 1.

The tensile strength, elongation and elastic modulus of the resulted film were measured by an autograph AG5000D manufactured by Shimadzu Corp. according to JIS C2318. The results are shown in Table 1.

Further, the dielectric constant and the dielectric tangent of the resulted film were measured at 1 MHz and 1 GHz using Impedance Material Analyzer manufactured by Hewlett Packard. The results are shown in Table 1.

The aromatic liquid-crystalline polyester solution was cast on a 18 µm thick rolled copper foil, the solvent was evaporated at 100° C. for 1 hour in a ventilation oven, then, the solution was further thermally treated at 250° C. for 1 hour, resultantly to obtain a laminate of a film having a thickness of 30 µm and a copper foil having a thickness of 18 µm. The resulted laminated substrate was immersed in a solder bath at given temperature for given times, and solder heat resistance was measured. The results are shown in Table 1.

Figure 1:
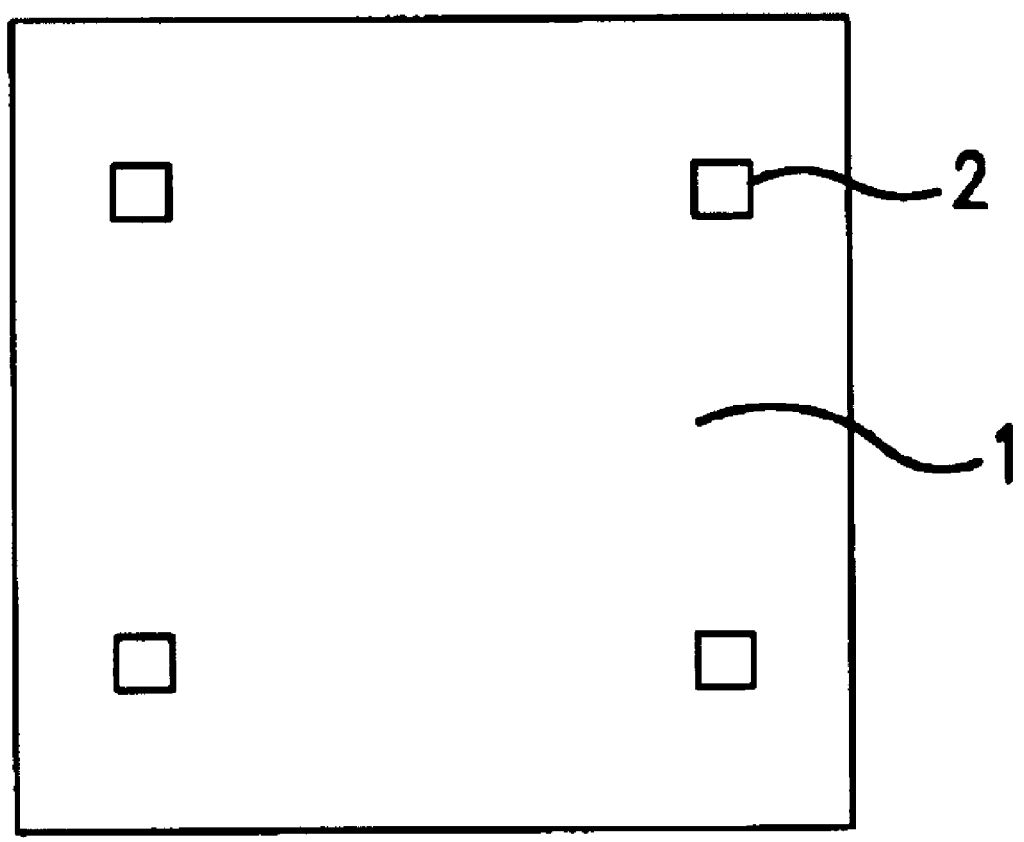
FIG. 1 is a view showing the form of a carrier tape for tape automated bonding according to an example of the present invention.

A film of 5 cm×5 cm cut out from this film was punching-processed into a shape having four sprockets of 5 mm×5 mm provided as shown in FIG. 1, and cracks around all sprockets were observed. The results are shown in Table 1. This film was punching-processed into a shape having sprockets provided as shown in FIG. 1, to effect pattern formation of the base layer, then, a surface-roughened copper foil having a thickness of 18 µm was crimped under heat for 10 minutes by a press machine under 250° C. and 50 kg/cm², to obtain a tape automated bonding tape. The appearance of the resulted TAB tape was evaluated based on the following criteria.

◯: Unevenness in film thickness, wrinkle, and peeling of a metal film are scarcely recognized.
X: Unevenness in film thickness, wrinkle, and peeling of a metal film are recognized.

The results are shown in Table 1.

Example 2

1 g of the aromatic liquid-crystalline polyester powder obtained in Synthesis Example 1 was added to 9 g of p-chlorophenol and the mixture was heated at 120° C., resultantly leading to completion of dissolution, obtaining a transparent solution. 1 g of a silica filler (1-FX/trade name, manufactured by Tatsumori K. K.) was added to this solution and the mixture was stirred and defoamed, to obtain an insulating resin solution composition.

As shown in FIG. 2(a), first, a glass epoxy substrate 1 carrying on both surfaces thereof copper-wiring patterns 2 on which blackening treatment had been performed was prepared. As shown in FIG. 2(b), the above-mentioned insulating resin composition was applied by a bar coater at a thickness of about 30 µm on the substrate 1, and thermally treated at 100° C. for 1 hour, subsequently, at 190° C. for 1 hours using a drying oven, to form a resin insulation layer 3.

As shown in FIG. 2(c), via holes 5 were made by UV-YAG laser process on the surface of the above-mentioned resin insulation layer 3, until the holes reached to the copper-wiring pattern 2. Then, as shown in FIG. 2(d), surface treatment was conducted with plasma, then, electro-less plating was performed.

As shown in FIG. 2(e), electric plating was performed using the resulted electroless-plating layer 4 as an electrode, to form a copper plating layer 6 having a thickness of 18 µm, to obtain a test sample. As shown in FIG. 2(f), a multi-layer printed wiring board was obtained by etching the copper-plating layer using etching liquid.

Though wirings were formed only on one surface of a substrate in this example, it is also possible to form wirings on both surfaces.

Regarding the resulted sample, the following tests were performed. The results are shown in Table 2.

Peeling Strength Test

The 1 cm width pattern 90° peeling test was conducted according to JIS-C6481.

Fine Wiring Pattern Forming Ability Test

Fine patterns of line/space=15 µm/15 µm were formed by a semi-additive method on a resin insulation layer, and the pattern form was observed by an optical microscope. No bottom failure from the top of wiring patterns was evaluated as good, failure particularly at a part of bottom edge portion was evaluated as failure of edge portion, and worse extend was evaluated as no good.

Cold-Heat Shock Rest

Cold-heat shock test was conducted at from −65° C. to 150° C. for 1000 cycles, and presence or absence of cracks on an insulating resin layer was observed.

Insulation Reliability Test

The insulation resistance was measured for 100 hours under conditions of 121° C., 85° C. and 20 V using a counter electrode pattern having a diameter of 1 cmφ, and maintenance of resistance at $10^6 \Omega$ or more was judged as acceptance.

Reflow Reliability Test

Substrates having various conductor patterns provided were subjected to pre-treatment of moisture absorbing preservation under JEDEC LEVEL 1, then, a solder reflow test was conducted 5 times at a temperature of 260° C., and problems such as pattern peeling and the like were observed. No peeling occurring in all tests was evaluated as OK, peeling of pattern after 4 to 5 tests was evaluated as small pattern peeling, peeling of pattern after 1 to 3 tests was evaluated as large pattern peeling, respectively.

Comparative Example 1

A 25 µm film produced according to the method described in Example 1 of JP-A No. 9-286907 was used as the aromatic liquid-crystalline polyester film, and measurements of molecular orientation, mechanical strength and dielectric property were conducted in the same manners as in Example 1. The film was crimped under heat by a press to a rolled copper foil of 18 μm, at 320° C.•50 kg/cm² for 10 minutes, and solder heat resistance was measured in the same manner as in Example 1. The results are shown in Table 1. Further in the same manner as in Example 1, the film was crimped under heat by a press to a copper foil of 18 μm, at 320° C.•50 kg/cm² for 10 minutes to produce a TAB tape, and the appearance thereof was evaluated in the same manner as in Example 1. The results are shown in Table 1.

Comparative Example 2

An inflation molded film (thickness: 25 μm) produced according to the method described in Example 1 of JP-A No. 9-286907 was crimped under heat to the glass epoxy substrate 1, at 320° C.·50 kg/cm² for 10 minutes, and a printed wiring board was produced in the same manner as in Example 2 and evaluated in the same manner as in Example 2.

TABLE 1

|  | Example 1 | Comparative example 1 |
|---|---|---|
| Molecular orientation (TD/MD) | 1.0 | 1.43 |
| Mechanical strength |  |  |
| Tensile strength (Mpa) | 138 (both for MD, TD) | 250 (Md), 50 (TD) |
| Tensile elongation (%) | 38 (both for MD, TD) | 1 (Md), 25 (TD) |
| Tensile modulus (Mpa) | 4000 (both for MD, TD) | 20000 (Md), 500 (TD) |
| Dielectric constant |  |  |
| 1 MHz | 2.9 | 3.9 |
| 1 GHz | 2.8 | 3.0 |
| Dielectric tangent |  |  |
| 1 MHz | 0.012 | 0.049 |
| 1 GHz | 0.004 | 0.012 |
| Solder heat resistance |  |  |
| at 260° C. for 10 seconds | No change | No change |
| at 270° C. for 10 seconds | No change | No change |
| at 280° C. for 10 seconds | No change | No change |
| Punching processability | ○ | Crack observed |
| TAB tape appearance | ○ | ○ |

TABLE 2

|  | Example 2 | Comparative example 2 |
|---|---|---|
| Peeling strength | 0.8 kg/cm | 0.2 kg/cm |
| Fine wiring pattern ability | Excellent | Failure at edge portion |
| Cold-heat shock rest | ○ | ○ |
| Insulation reliability test | Acceptance | ○ |
| Reflow reliability | OK | Small pattern peeling |

According to the present invention, a laminate obtained by laminating an aromatic liquid-crystalline polyester film and a metal layer, having excellent processability due to small anisotropy while keeping excellent electric properties, and a tape automated bonding tape, film condenser and printed wiring board using the same, can be provided.

What is claimed is:

1. A laminate obtained by dissolving an aromatic liquid-crystalline polyester in an organic solvent to obtain a solution, casting the solution and removing the solvent to give a film, and laminating the film with a metal layer wherein the organic solvent is a solvent containing 30% by weight or more of a phenol compound selected from the group consisting of Formula (I)

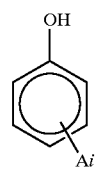

and Formula (II)

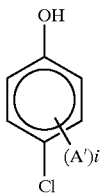

wherein A represents a halogen atom or trihalogenated methyl group, A' represents a hydrogen atom, halogen atom, or trihalogenated methyl group and i represents an integer from 1 to 5, provided that when i is 2 or more, a plurality of A may be mutually the same or different.

2. The laminate according to claim 1, wherein the aromatic liquid-crystalline polyester comprises 30 to 80 mol % of a repeating structural unit derived from p-hydroxybenzoic acid, 10 to 35 mol % of a repeating structural unit derived from at least one compound selected from the group consisting of hydroquinone, resorcinol, 4,4'-dihydroxybiphenyl, bisphenol A and bisphenol S, and 10 to 35 mol % of a repeating structural unit derived from at least one compound selected from the group consisting of terephthalic acid, isophthalic acid and naphthalenedicarboxylic acid.

3. The laminate according to claim 1, wherein the aromatic liquid-crystalline polyester comprises 30 to 80 mol % of a repeating structural unit derived from p-hydroxybenzoic acid, 10 to 35 mol % of a repeating structural unit derived from at least one compound selected from the group consisting of hydroquinone and 4,4'-dihydroxybiphenyl, and 10 to 35 mol % of a repeating structural unit derived from at least one compound selected from the group consisting of terephthalic acid and isophthalic acid.

4. The laminate according to claim 1, wherein the metal layer is made of at least one metal selected from the group consisting of gold, silver, copper, nickel and aluminum.

5. A tape automated bonding tape comprising the laminate according to claim 1.

6. A film condenser comprising the laminate according to claim 1.

7. A printed wiring board comprising the laminate according to claim 1.

* * * * *